United States Patent
Ogawa et al.

(10) Patent No.: US 9,779,993 B2
(45) Date of Patent: Oct. 3, 2017

(54) WAFER PROCESSING METHOD INCLUDING ATTACHING A PROTECTIVE TAPE TO A FRONT SIDE OF A FUNCTIONAL LAYER TO PREVENT DEBRIS ADHESION

(71) Applicant: DISCO CORPORATION, Tokyo (JP)

(72) Inventors: Yuki Ogawa, Tokyo (JP); Kensuke Nagaoka, Tokyo (JP); Tsubasa Obata, Tokyo (JP); Yuri Ban, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 14/882,990

(22) Filed: Oct. 14, 2015

(65) Prior Publication Data
US 2016/0111331 A1    Apr. 21, 2016

(30) Foreign Application Priority Data

Oct. 21, 2014   (JP) .................................. 2014-214541

(51) Int. Cl.
*H01L 21/683* (2006.01)
*H01L 21/67* (2006.01)
*H01L 21/78* (2006.01)

(52) U.S. Cl.
CPC ........ *H01L 21/78* (2013.01); *H01L 21/67092* (2013.01); *H01L 21/67132* (2013.01); *H01L 21/6836* (2013.01); *H01L 2221/6834* (2013.01); *H01L 2221/68327* (2013.01); *H01L 2221/68336* (2013.01); *H01L 2221/68386* (2013.01)

(58) Field of Classification Search
None
See application file for complete search history.

(56) References Cited

U.S. PATENT DOCUMENTS

| | | | | |
|---|---|---|---|---|
| 2006/0105546 A1* | 5/2006 | Genda | ................. | B81C 1/00888 438/463 |
| 2006/0205183 A1* | 9/2006 | Morikazu | ............ | B28D 5/0011 438/463 |
| 2007/0190318 A1* | 8/2007 | Asai | .................... | C08G 18/6229 428/343 |
| 2008/0242052 A1* | 10/2008 | Feng | ................... | H01L 21/3043 438/459 |

FOREIGN PATENT DOCUMENTS

JP   2005-064231   3/2005

\* cited by examiner

*Primary Examiner* — Jay C Chang
(74) *Attorney, Agent, or Firm* — Greer Burns & Crain, Ltd.

(57) ABSTRACT

A method for dividing a wafer including: attaching a protective tape to a functional layer of the wafer with the adhesive layer of the tape in contact with the functional layer; and a wafer dividing step. The dividing step includes a cut groove forming step and a laser processing step. The cut groove forming step uses a blade to form a cut groove with a depth that does not reach the functional layer, resulting in part of the substrate being left along each division line. The laser processing step includes applying a laser beam to the part of the substrate left after the cut groove forming step and the functional layer of the wafer to form a laser processed groove having a depth reaching the tape. The tape is closely attached to the functional layer during the tape attaching step to prevent the adhesion of debris to the devices.

5 Claims, 12 Drawing Sheets

WAFER PROCESSING METHOD INCLUDING ATTACHING A PROTECTIVE TAPE TO A FRONT SIDE OF A FUNCTIONAL LAYER TO PREVENT DEBRIS ADHESION

BACKGROUND OF THE INVENTION

Field of the Invention

The present invention relates to a wafer processing method for dividing a wafer into a plurality of individual devices along a plurality of division lines formed on the front side of the wafer, the wafer being composed of a substrate and a functional layer formed on the front side of the substrate, the individual devices being formed from the functional layer and partitioned by the division lines.

Description of the Related Art

As well known in the art, in a semiconductor device fabrication process, a functional layer composed of an insulating film and a functional film is formed on the front side of a substrate such as a silicon substrate, and a plurality of devices such as ICs and LSIs are formed like a matrix from this functional layer, thus obtaining a semiconductor wafer having the plural devices. The plural devices are partitioned by a plurality of division lines formed on the front side of the semiconductor wafer. The semiconductor wafer is divided along these division lines to obtain individual device chips corresponding to the plural devices.

In recent years, a semiconductor wafer intended to improve the processing performance of semiconductor chips (devices) such as ICs and LSIs has been put into practical use. This semiconductor wafer is composed of a substrate such as a silicon substrate and a functional layer formed on the front side of the substrate, wherein the functional layer is composed of a low-permittivity insulator film (low-k film) and a functional film formed on the low-k film, the functional film forming a plurality of circuits. Thus, the semiconductor devices are formed from the functional layer. The low-k film is formed from an inorganic film of SiOF, BSG (SiOB), etc. or an organic film such as a polymer film of polyimide, parylene, etc.

Division of such a semiconductor wafer along the division lines is usually performed by using a cutting apparatus called a dicing saw. This cutting apparatus includes a chuck table as workpiece holding means for holding the semiconductor wafer as a workpiece, cutting means for cutting the semiconductor wafer held on the chuck table, and moving means for relatively moving the chuck table and the cutting means. The cutting means includes a rotating spindle adapted to be rotated at high speeds and a cutting blade mounted on the rotating spindle. The cutting blade is composed of a disk-shaped base and an annular cutting edge mounted on one side surface of the base along the outer circumference thereof. The annular cutting edge is an electroformed diamond blade formed by bonding diamond abrasive grains having a grain size of about 3 μm, for example.

However, the low-k film mentioned above is different in material from the substrate of the semiconductor wafer, so that it is difficult to cut the substrate together with the low-k film by using the cutting blade. That is, the low-k film is very brittle like mica. Accordingly, when the semiconductor wafer having the low-k film is cut along the division lines by using the cutting blade, there arises a problem such that the low-k film may be separated and this separation (delamination) may reach the device (circuits) to cause fatal damage to the devices.

To solve this problem, Japanese Patent Laid-open No. 2005-64231 discloses a wafer dividing method including the steps of applying a laser beam along both sides of each division line on a semiconductor wafer to form two laser processed grooves along each division line, thereby dividing the functional layer, and next positioning a cutting blade between the two laser processed grooves along each division line to relatively move the cutting blade and the semiconductor wafer, thereby cutting the semiconductor wafer along each division line.

SUMMARY OF THE INVENTION

In the wafer processing method disclosed in Japanese Patent Laid-open No. 2005-64231 mentioned above, a laser beam is applied along both sides of each division line formed on the semiconductor wafer to thereby form the two laser processed grooves dividing the functional layer along each division line. Thereafter, the cutting blade is positioned between the two laser processed grooves along each division line and then operated to cut the semiconductor wafer along each division line. Accordingly, this conventional method has the following problems.

(1) At least two laser processed grooves must be formed along each division line to divide the functional layer. Accordingly, the productivity is reduced.

(2) When the division of the functional layer in forming the laser processed grooves is insufficient, the cutting blade may be deviated or tilted or uneven wearing of the cutting blade may occur.

(3) When the laser beam is applied to the wafer from the front side thereof to form the laser processed grooves, debris scatters and sticks to the front side of the wafer. Accordingly, a protective film must be formed on the front side of the wafer.

(4) To form the two laser processed grooves along each division line, the laser beam is applied in two passes along each division line. As a result, thermal strain remains in the wafer to cause a reduction in die strength of each device.

(5) Since the spacing between the two laser processed grooves along each division line is larger than the width of the cutting blade, the width of each division line must be increased to cause a decrease in number of devices that can be formed on the wafer.

(6) In some wafer, a passivation film of $SiO_2$, SiO, SiN, SiNO, etc. is formed on the front side of the functional layer. Accordingly, when a laser beam is applied to the wafer from the front side thereof, the laser beam passes through the passivation film to reach the inside of the functional layer. As a result, the functional layer is processed by the laser beam and the energy of the laser beam is confined by the passivation film, so that there is a possibility of so-called undercut such that the processing by the laser beam may spread laterally to each device.

It is therefore an object of the present invention to provide a wafer processing method which can divide a wafer into a plurality of individual devices along a plurality of division lines without the above problems, wherein the wafer includes a substrate and a functional layer formed on the front side of the substrate, and the individual devices are formed from the functional layer and partitioned by the division lines.

In accordance with an aspect of the present invention, there is provided a wafer processing method for dividing a wafer into a plurality of individual devices along a plurality of division lines formed on the front side of the wafer, the wafer being composed of a substrate and a functional layer formed on the front side of the substrate, the individual devices being formed from the functional layer and partitioned by the division lines, the wafer processing method including a protective tape attaching step of attaching a protective tape having an adhesive layer to the front side of the functional layer of the wafer in the condition where the adhesive layer of the protective tape is in contact with the front side of the functional layer; and a wafer dividing step of holding the wafer processed by the protective tape attaching step on a holding surface of a chuck table in the condition where the protective tape is in contact with the holding surface, and next applying a laser beam having an absorption wavelength to the substrate and the functional layer of the wafer from the back side of the substrate along each division line to form a laser processed groove having a depth reaching the protective tape along each division line, thereby dividing the wafer into individual device chips corresponding to the individual devices; wherein the protective tape is closely attached to the front side of the functional layer in the protective tape attaching step in such a manner that the adhesive layer of the protective tape comes into tight contact with the devices formed from the functional layer, so as to prevent the adhesion of debris to the front side of each device, the debris being generated from the wafer along each division line by the application of the laser beam in the wafer dividing step.

According to the wafer processing method of the present invention, the protective tape is closely attached to the front side of the functional layer in the protective tape attaching step in such a manner that the adhesive layer of the protective tape comes into tight contact with the devices formed from the functional layer, so as to prevent the adhesion of debris to the front side of each device, the debris being generated from the wafer along each division line by the application of the laser beam in the wafer dividing step. As mentioned above, in the wafer dividing step, debris may be generated from the wafer by the application of the laser beam having an absorption wavelength to the substrate and the functional layer. However, since the protective tape is closely attached to the functional layer in such a manner that the adhesive layer of the protective tape is in tight contact with the devices formed from the functional layer, the debris can be prevented from adhering to the devices.

The wafer processing method according to the present invention can also exhibit the following effects.

(1) It is unnecessary to form a plurality of laser processed grooves for dividing the functional layer along each division line, so that the productivity can be improved.

(2) No laser processed groove is formed in the functional layer before cutting the substrate with the cutting blade. Accordingly, there is no possibility that the cutting blade may be deviated or tilted and there is no possibility of uneven wearing of the cutting blade.

(3) Since the laser beam is not applied from the front side of the wafer, a protective film for covering the front side of the wafer is not required.

(4) Since the cut groove is formed on the back side of the substrate along each division line, it is unnecessary to increase the width of each division line, so that the number of devices that can be formed on the wafer can be increased.

(5) Since the laser beam is not applied from the front side of the wafer, there is no possibility that the laser beam may pass through the passivation film of $SiO_2$, SiO, SiN, SiNO, etc. to process the functional layer and the heat generated in the functional layer may be temporarily confined by the passivation film to cause the lateral spread of the processing to each device.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1A:
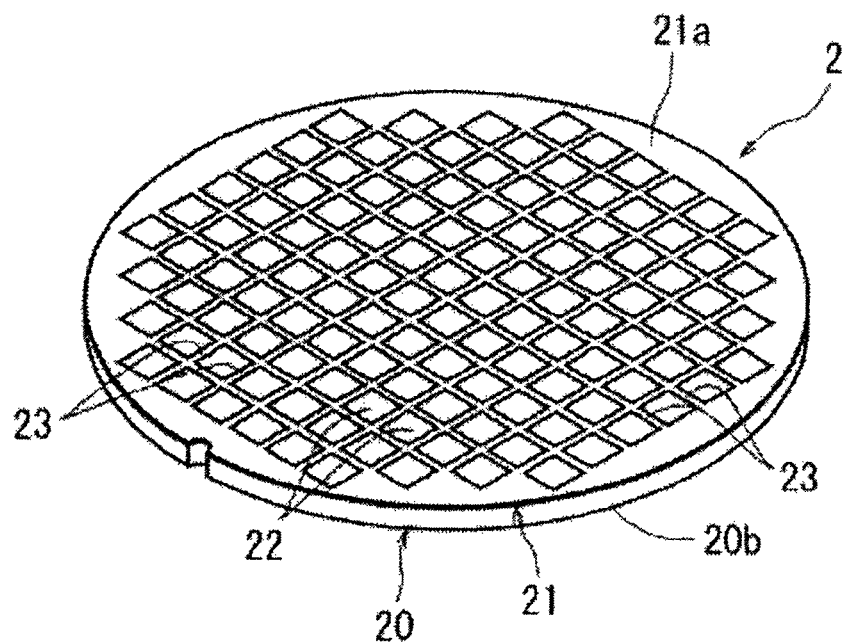
FIG. 1A is a perspective view of a semiconductor wafer.
Figure 1B:
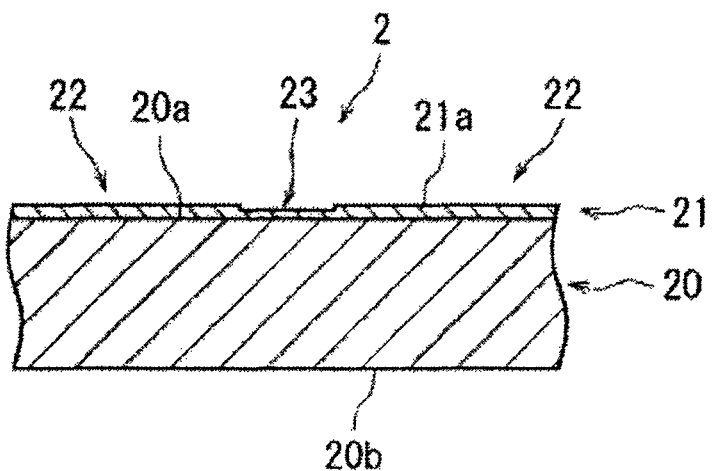
FIG. 1B is an enlarged sectional view of an essential part of the semiconductor wafer shown in FIG. 1A.

The wafer processing method according to the present invention will now be described in more detail with reference to the attached drawings. FIG. 1A is a perspective view of a semiconductor wafer 2 to be divided into individual devices by the wafer processing method according to the present invention, and FIG. 1B is an enlarged sectional view of an essential part of the semiconductor wafer 2 shown in FIG. 1A. As shown in FIGS. 1A and 1B, the semiconductor wafer 2 is composed of a substrate 20 such as a silicon substrate and a functional layer 21 formed on the front side 20a of the substrate 20. For example, the substrate 20 has a thickness of 200 μm. The functional layer 21 is composed of an insulating film and a functional film formed on the insulating film, the functional film forming a plurality of circuits. A plurality of devices 22 such as ICs and LSIs are formed like a matrix from the functional layer 21. These devices 22 are partitioned by a plurality of crossing division lines 23 formed on the functional layer 21. In this preferred embodiment, the insulating film constituting the functional layer 21 is provided by an $SiO_2$ film or a low-permittivity insulator film (low-k film). Examples of the low-k film include an inorganic film of SiOF, BSG (SiOB), etc. and an organic film such as a polymer film of polyimide, parylene, etc. For example, the thickness of the insulating film is set to 10 μm. Further, a passivation film of $SiO_2$, SiO, SiN, SiNO, etc. is formed on the front side 21a of the functional layer 21.

Figure 2A:
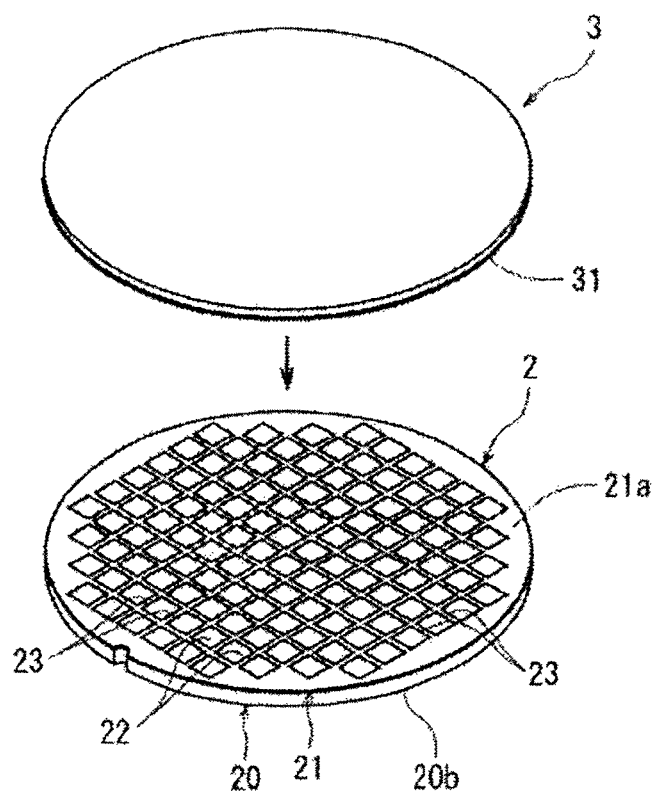
FIGS. 2A to 2C are perspective views for illustrating a protective tape attaching step.
Figure 2B:
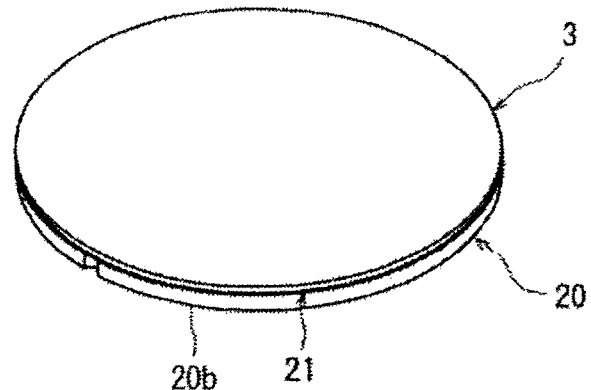
Figure 2C:
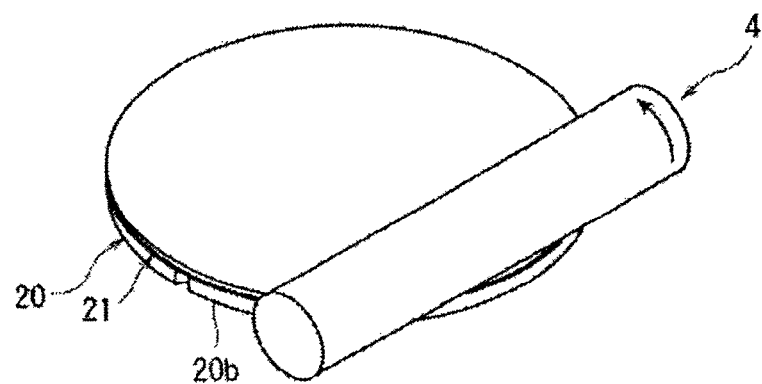

The wafer processing method for dividing the semiconductor wafer 2 along the division lines 23 will now be described. First, a protective tape attaching step is performed in such a manner a protective tape having an adhesive layer is attached to the front side 21a of the functional layer 21 constituting the semiconductor wafer 2 in the condition where the adhesive layer of the protective tape is in contact with the front side 21a of the functional layer 21. More specifically, as shown in FIGS. 2A and 2B, a protective tape 3 having an adhesive layer 31 is attached to the front side 21a of the functional layer 21 of the semiconductor wafer 2 in the condition where the adhesive layer 31 of the protective tape 3 is in contact with the front side 21a of the functional layer 21. That is, the protective tape 3 is composed of a base sheet and the adhesive layer 31 formed on the front side (one side) of the base sheet. The base sheet is formed of polyvinyl chloride (PVC) and has a thickness of 100 μm. The adhesive layer 31 is formed of acrylic resin and has a thickness of about 5 μm. In this protective tape attaching step, it is important to closely attach the protective tape 3 to the front side 21a of the functional layer 21 in such a manner that the adhesive layer 31 of the protective tape 3 comes into tight contact with the devices 22 formed from the functional layer 21, so as to prevent the adhesion of debris to the front side of each device 22, wherein the debris may be generated along each division line 23 by applying a laser beam in a wafer dividing step to be performed later. In this preferred embodiment, after attaching the protective tape 3 to the front side 21a of the functional layer 21 of the semiconductor wafer 2 as shown in FIGS. 2A and 2B, a pressing roller 4 is rolled on the protective tape 3 to apply a pressure to the protective tape 3 as shown in FIG. 2C, thereby making the adhesive layer 31 into tight contact with the devices 22 formed from the functional layer 21.

Figure 3:
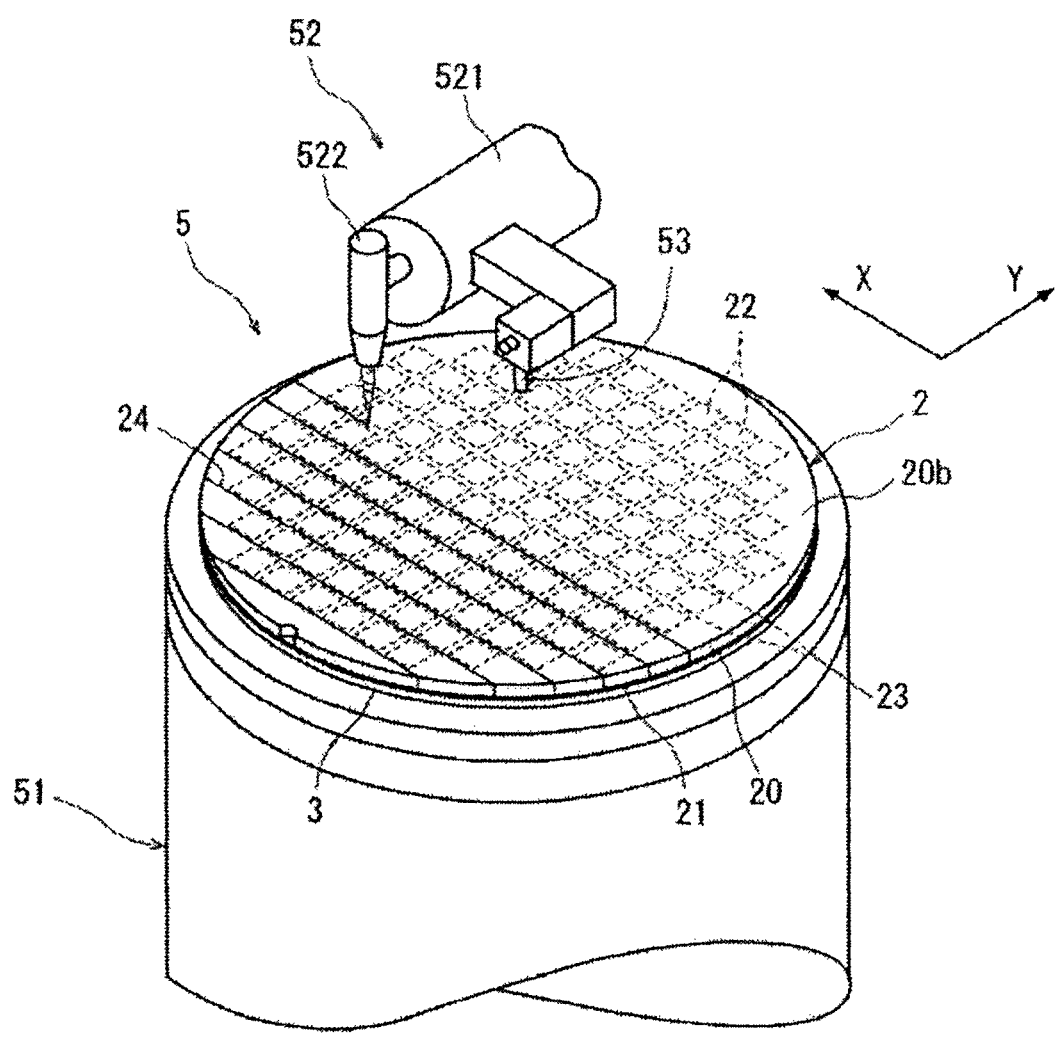
FIG. 3 is a perspective view of an essential part of a laser processing apparatus for performing a first preferred embodiment of a wafer dividing step.

After performing the protective tape attaching step mentioned above, a first preferred embodiment of a wafer dividing step is performed in such a manner that the semiconductor wafer 2 with the protective tape 3 is held on a holding surface of workpiece holding means in the condition where the protective tape 3 is in contact with the holding surface and a laser beam having an absorption wavelength to the substrate 20 and the functional layer 21 is next applied to the semiconductor wafer 2 from the back side 20b of the substrate 20 along each division line 23 to form a laser processed groove having a depth reaching the protective tape 3 along each division line 23, thereby dividing the semiconductor wafer 2 into individual device chips. The first preferred embodiment of this wafer dividing step is performed by using a laser processing apparatus 5 shown in FIG. 3. The laser processing apparatus 5 shown in FIG. 3 includes a chuck table 51 as workpiece holding means for holding a workpiece, laser beam applying means 52 for applying a laser beam to the workpiece held on the upper surface of the chuck table 51 as a holding surface, and imaging means 53 for imaging the workpiece held on the chuck table 51. The chuck table 51 is so configured as to hold the workpiece on the holding surface under suction. The chuck table 51 is movable both in the feeding direction shown by an arrow X in FIG. 3 by feeding means (not shown) and in the indexing direction shown by an arrow Y in FIG. 3 by indexing means (not shown).

The laser beam applying means 52 includes a cylindrical casing 521 extending in a substantially horizontal direction, laser beam oscillating means (not shown) provided in the casing 521 for oscillating a pulsed laser beam, and focusing means 522 mounted on the front end of the casing 521 for applying the pulsed laser beam to the workpiece. The imaging means 53 is mounted on a front end portion of the casing 521 constituting the laser beam applying means 52. Although not shown, the imaging means 53 includes an ordinary imaging device (CCD) for imaging the workpiece by using visible light, infrared light applying means for applying infrared light to the workpiece, an optical system for capturing the infrared light applied to the workpiece by the infrared light applying means, and an imaging device (infrared CCD) for outputting an electrical signal corresponding to the infrared light captured by the optical system. An image signal output from the imaging means 53 is transmitted to control means (not shown).

The first preferred embodiment of the wafer dividing step to be performed by using the laser processing apparatus 5 will now be described with reference to FIG. 3 and FIGS. 4A to 4C. First, the semiconductor wafer 2 processed by the protective tape attaching step is placed on the chuck table 51 of the laser processing apparatus 5 shown in FIG. 3 in the condition where the protective tape 3 attached to the semiconductor wafer 2 is in contact with the upper surface (holding surface) of the chuck table 51. Thereafter, suction means (not shown) is operated to hold the semiconductor wafer 2 through the protective tape 3 on the chuck table 51 under suction (wafer holding step). Accordingly, the back side 20b of the substrate 20 of the semiconductor wafer 2 held on the chuck table 51 is oriented upward. Although an annular frame supporting the protective tape 3 is not shown in FIG. 3, this annular frame is held by suitable frame holding means provided on the chuck table 51. Thereafter, the chuck table 51 holding the semiconductor wafer 2 is moved to a position directly below the imaging means 53 by operating the feeding means (not shown).

In the condition where the chuck table 51 is positioned directly below the imaging means 53, an alignment operation is performed by the imaging means 53 and the control means (not shown) to detect a subject area of the semiconductor wafer 2 to be laser-processed. More specifically, the imaging means 53 and the control means perform image processing such as pattern matching for making the alignment of the division lines 23 extending in a first direction on the functional layer 21 of the semiconductor wafer 2 and the focusing means 522 of the laser beam applying means 52 for applying the laser beam to the wafer 2 along the division lines 23, thus performing the alignment of a laser beam applying position (alignment step). Similarly, the alignment of a laser beam applying position is performed for the other division lines 23 extending in a second direction perpendicular to the first direction on the functional layer 21. Although the front side 21a of the functional layer 21 on which the division lines 23 are formed is oriented downward, the division lines 23 can be imaged from the back side 20b of the substrate 20 because the imaging means 53 includes the infrared light applying means for applying infrared light, the optical system for capturing the infrared light, and the imaging device (infrared CCD) for outputting an electrical signal corresponding to the infrared light.

Figure 4A:
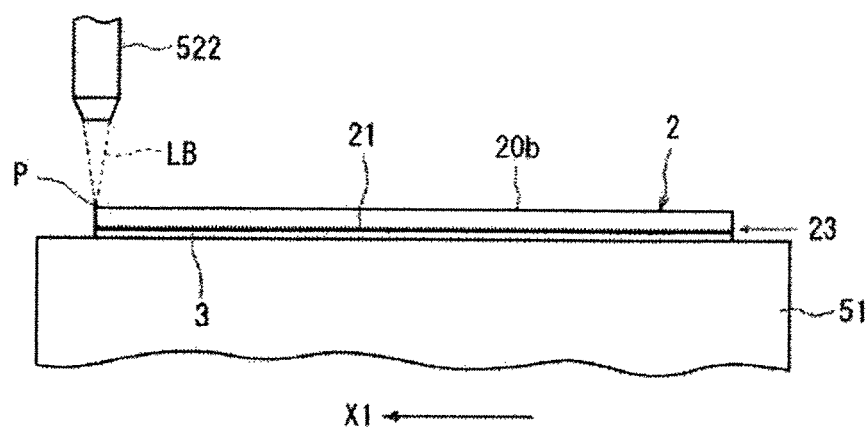
FIGS. 4A to 4C are views for illustrating the first preferred embodiment of the wafer dividing step.
Figure 4B:
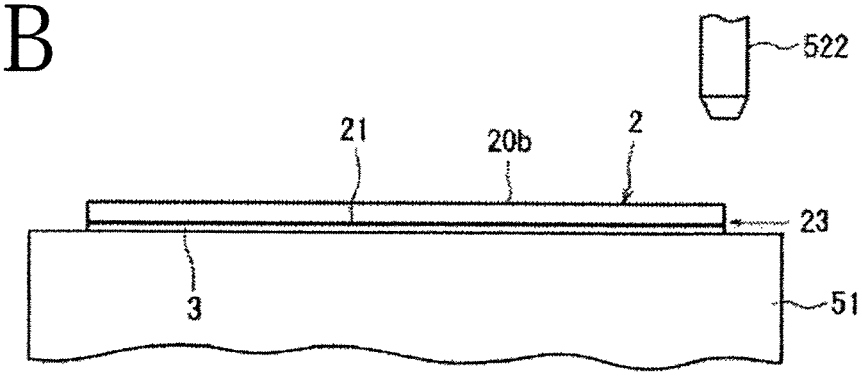

After performing the alignment step mentioned above, the chuck table 51 is moved to a laser beam applying area where the focusing means 522 of the laser beam applying means 52 is located as shown in FIG. 4A, thereby positioning one end (left end as viewed in FIG. 4A) of a predetermined one of the division lines 23 extending in the first direction directly below the focusing means 522. Further, the focal point P of the pulsed laser beam to be applied from the focusing means 522 is set near the back side 20b of the substrate 20. Thereafter, the pulsed laser beam having an absorption wavelength to the substrate 20 and the functional layer 21 is applied from the focusing means 522 to the wafer 2, and the chuck table 51 is moved in the direction shown by an arrow X1 in FIG. 4A at a predetermined feed speed. When the other end (right end as viewed in FIG. 4B) of the predetermined division line 23 reaches the position directly below the focusing means 522 as shown in FIG. 4B, the application of the pulsed laser beam is stopped and the movement of the chuck table 51 is also stopped.

For example, the wafer dividing step mentioned above may be performed under the following processing conditions.

Figure 4C:
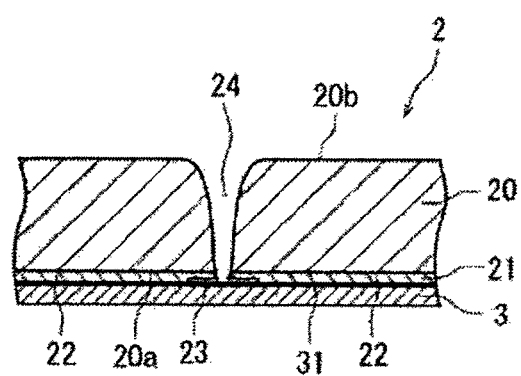

Light source: YAG pulsed laser
Wavelength: 355 nm
Repetition frequency: 200 kHz
Average power: 3 W
Focused spot diameter: 10 μm
Work feed speed: 300 mm/second After performing the wafer dividing step along the predetermined division line 23 as mentioned above, the chuck table 51 is moved in the indexing direction of the arrow Y by an amount corresponding to the pitch of the division lines 23 (indexing step), and the wafer dividing step is performed similarly along the next division line 23 extending in the first direction. After performing the wafer dividing step along all of the division lines 23 extending in the first direction, the chuck table 51 is rotated 90 degrees to similarly perform the wafer dividing step along all of the remaining division lines 23 extending in the second direction perpendicular to the first direction. As a result, a laser processed groove 24 having a depth reaching the protective tape 3 is formed in the substrate 20 and the functional layer 21 of the semiconductor wafer 2 along each division line 23 as shown in FIG. 4C. Accordingly, the semiconductor wafer 2 is divided by the laser processed grooves 24 to obtain the individual device chips corresponding to the devices 22. In this wafer dividing step, debris may be generated from the semiconductor wafer 2 by the application of the pulsed laser beam having an absorption wavelength to the substrate 20 and the functional layer 21. However, since the protective tape 3 is closely attached to the functional layer 21 in such a manner that the adhesive layer 31 of the protective tape 3 is in tight contact with the devices 22 formed from the functional layer 21, the debris can be prevented from adhering to the devices 22. The debris generated by the application of the pulsed laser beam adheres to the adhesive layer 31 of the protective tape 3 in an area corresponding to each division line 23.

Figure 5:
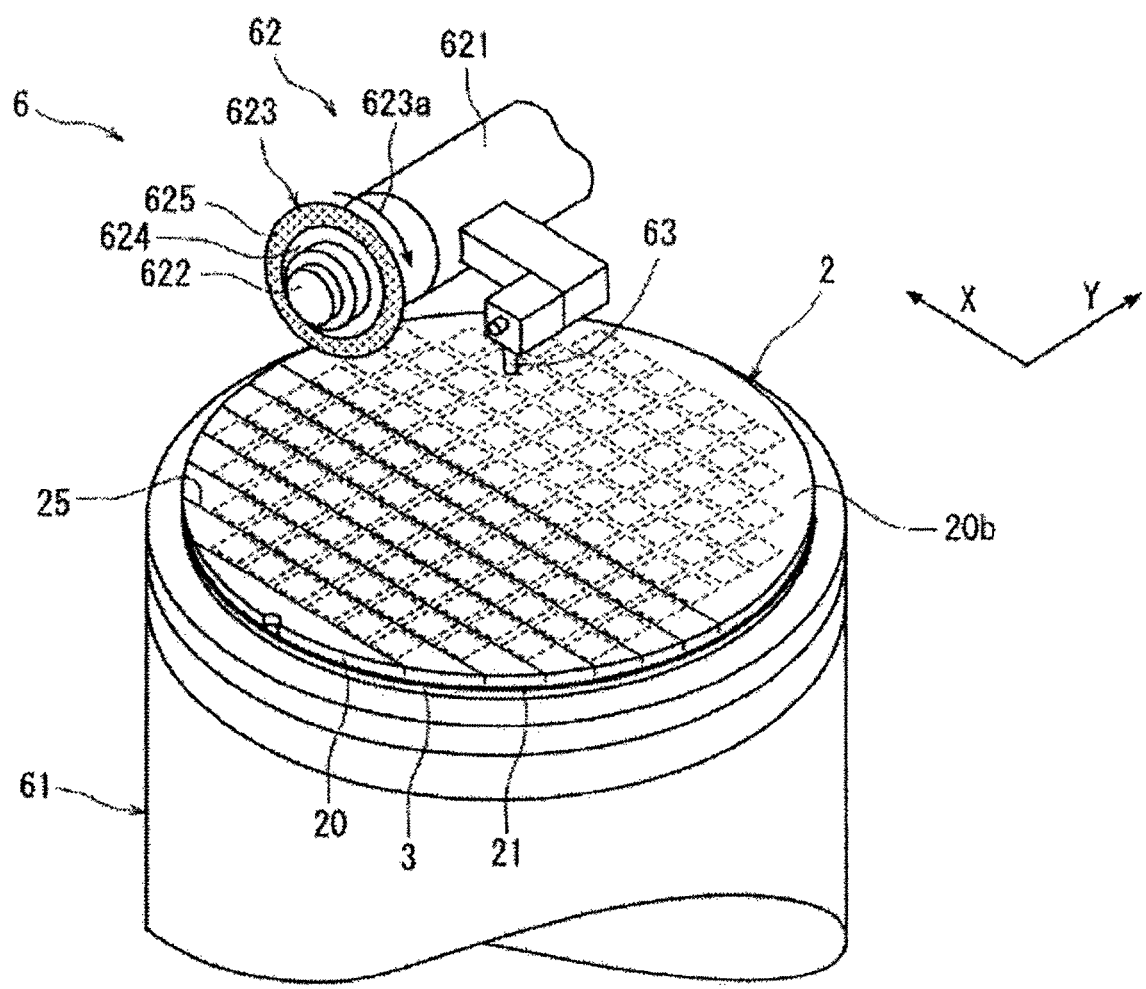
FIG. 5 is a perspective view of an essential part of a cutting apparatus for performing a cut groove forming step in a second preferred embodiment of the wafer dividing step.

A second preferred embodiment of the wafer dividing step will now be described with reference to FIGS. 5 to 8D. In the second preferred embodiment of the wafer dividing step, a cut groove forming step is first performed in such a manner that the substrate 20 of the semiconductor wafer 2 is cut from the back side 20b in an area corresponding to each division line 23 by using a cutting blade to thereby form a cut groove having a depth not reaching the functional layer 21 so that part of the substrate 20 is left in this area. This cut groove forming step is performed by using a cutting apparatus 6 shown in FIG. 5. As shown in FIG. 5, the cutting apparatus 6 includes a chuck table 61 as workpiece holding means for holding a workpiece, cutting means 62 for cutting the workpiece held on the chuck table 61, and imaging means 63 for imaging the workpiece held on the chuck table 61. The chuck table 61 has an upper surface as a holding surface for holding the workpiece thereon under suction. The chuck table 61 is movable both in the feeding direction shown by an arrow X in FIG. 5 by feeding means (not shown) and in the indexing direction shown by an arrow Y in FIG. 5 by indexing means (not shown).

The cutting means 62 includes a spindle housing 621 extending in a substantially horizontal direction, a rotating spindle 622 rotatably supported to the spindle housing 621, and a cutting blade 623 mounted on the rotating spindle 622 at a front end portion thereof. The rotating spindle 622 is adapted to be rotated in the direction shown by an arrow 623a by a servo motor (not shown) provided in the spindle housing 621. The cutting blade 623 is composed of a disk-shaped base 624 formed of aluminum and an annular cutting edge 625 mounted on one side surface of the base 624 along the outer circumference thereof. The annular cutting edge 625 is an electroformed diamond blade produced by bonding diamond abrasive grains having a grain size of 3 to 4 μm with nickel plating to the side surface of the outer circumferential portion of the base 624. For example, the cutting edge 625 has a thickness of 40 μm and an outer diameter of 52 mm.

The imaging means 63 is mounted on a front end portion of the spindle housing 621. Although not shown, the imaging means 63 includes an ordinary imaging device (CCD) for imaging the workpiece by using visible light, infrared light applying means for applying infrared light to the workpiece, an optical system for capturing the infrared light applied to the workpiece by the infrared light applying means, and an imaging device (infrared CCD) for outputting an electrical signal corresponding to the infrared light captured by the optical system. An image signal output from the imaging means 63 is transmitted to control means (not shown).

In performing the cut groove forming step by using the cutting apparatus 6 mentioned above, the semiconductor wafer 2 processed by the protective tape attaching step is placed on the chuck table 61 in the condition where the protective tape 3 attached to the semiconductor wafer 2 is in contact with the upper surface (holding surface) of the chuck table 61 as shown in FIG. 5. Thereafter, suction means (not shown) is operated to hold the semiconductor wafer 2 through the protective tape 3 on the chuck table 61 under suction (wafer holding step). Accordingly, the back side 20b of the substrate 20 of the semiconductor wafer 2 held on the chuck table 61 is oriented upward. Although an annular frame supporting the protective tape 3 is not shown in FIG. 5, this annular frame is held by suitable frame holding means provided on the chuck table 61. Thereafter, the chuck table 61 holding the semiconductor wafer 2 is moved to a position directly below the imaging means 63 by operating the feeding means (not shown).

In the condition where the chuck table 61 is positioned directly below the imaging means 63, an alignment operation is performed by the imaging means 63 and the control means (not shown) to detect a subject area of the semiconductor wafer 2 to be cut. More specifically, the imaging means 63 and the control means perform image processing such as pattern matching for making the alignment of the cutting blade 623 and the area of the substrate 20 corresponding to each division line 23 extending in a first direction on the functional layer 21 of the semiconductor wafer 2, thus performing the alignment of the cut area by the cutting blade 623 (alignment step). Similarly, the alignment of another cut area by the cutting blade 623 is performed for the remaining division lines 23 extending in a second direction perpendicular to the first direction on the functional layer 21. Although the front side 21a of the functional layer 21 on which the division lines 23 are formed is oriented downward, the division lines 23 can be imaged from the back side 20b of the substrate 20 because the imaging means 63 includes the infrared light applying means for applying infrared light, the optical system for capturing the infrared light, and the imaging device (infrared CCD) for outputting an electrical signal corresponding to the infrared light.

Figure 6A:
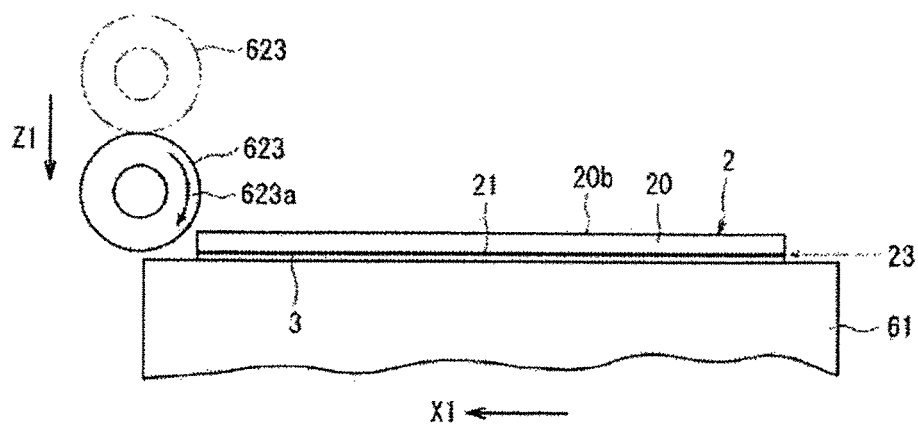
FIGS. 6A to 6D are views for illustrating the cut groove forming step.

After performing the alignment step mentioned above to detect the area of the substrate 20 corresponding to each division line 23 of the semiconductor wafer 2 held on the chuck table 61, the chuck table 61 is moved to a cut start position in the cut area by the cutting blade 623, thereby positioning one end (left end as viewed in FIG. 6A) of a predetermined one of the division lines 23 on the right side of a position directly below the cutting blade 623 by a predetermined amount as shown in FIG. 6A.

Figure 6B:
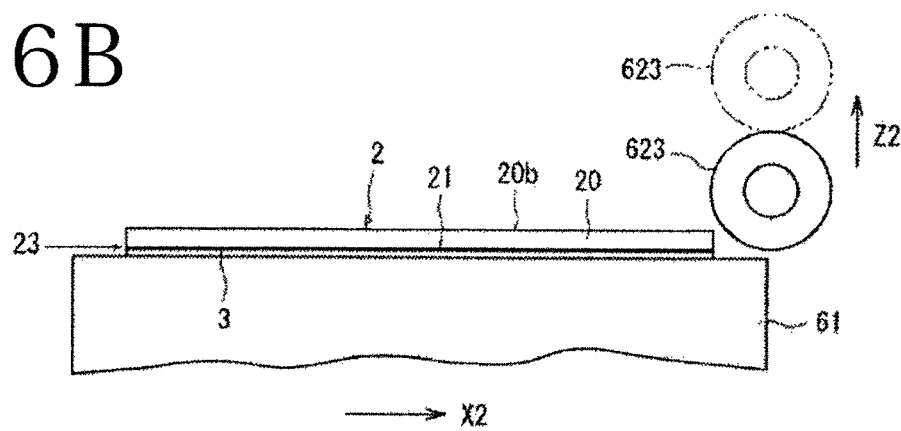
Figure 6C:
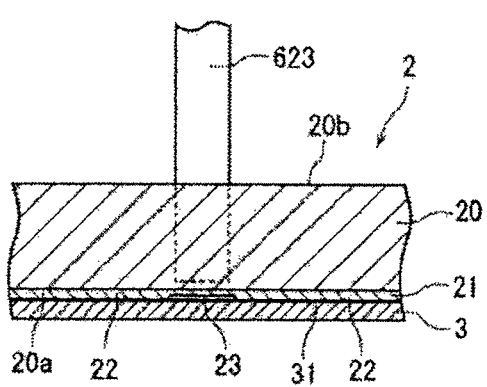

In the condition where the semiconductor wafer 2 held on the chuck table 61 is set at the cut start position in the cut area as described above, the cutting blade 623 is lowered from a standby position shown by a phantom line in FIG. 6A to a working position shown by a solid line in FIG. 6A as shown by an arrow Z1 in FIG. 6A. As shown in FIGS. 6A and 6C, this working position is set so that the lower end of the cutting blade 623 does not reach the functional layer 21 of the semiconductor wafer 2 (e.g., the lower end of the cutting blade 623 is set at a vertical position raised from the front side 20a of the substrate 20 toward the back side 20b thereof by an amount of 5 to 10 μm).

Figure 6D:
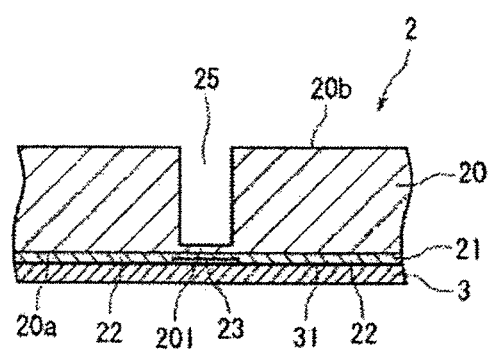

Thereafter, the cutting blade 623 is rotated in the direction shown by an arrow 623a in FIG. 6A at a predetermined rotational speed, and the chuck table 61 is moved in the direction shown by an arrow X1 in FIG. 6A at a predetermined feed speed. When the other end (right end as viewed in FIG. 6B) of the predetermined division line 23 reaches a position on the left side of the position directly below the cutting blade 623 by a predetermined amount as shown in FIG. 6B, the movement of the chuck table 61 is stopped. As a result, a cut groove 25 is formed on the back side 20b of the substrate 20 of the semiconductor wafer 2 along the predetermined division line 23 so that the depth of the cut groove 25 does not reach the functional layer 21, that is, part 201 of the substrate 20 is left on the front side 20a as shown in FIG. 6D (cut groove forming step).

Thereafter, the cutting blade 623 is raised from the working position to the standby position as shown by an arrow Z2 in FIG. 6B, and the chuck table 61 is next moved in the direction shown by an arrow X2 in FIG. 6B to the position shown in FIG. 6A. Thereafter, the chuck table 61 is moved in the direction (indexing direction) perpendicular to the sheet plane of FIG. 6A by an amount corresponding to the pitch of the division lines 23, thereby aligning the cutting blade 623 with the area corresponding to the next division line 23 extending in the first direction. In the condition where the cutting blade 623 is aligned with the area corresponding to the next division line 23 as mentioned above, the cut groove forming step is performed similarly.

For example, the cut groove forming step mentioned above is performed under the following processing conditions.

Outer diameter of cutting blade: 52 mm
Thickness of cutting blade: 40 μm
Rotational speed of the cutting blade: 30000 rpm
Work feed speed: 50 mm/second In this manner, the cut groove forming step is similarly performed along all of the division lines 23 extending in the first direction, the chuck table 61 is rotated 90 degrees to similarly perform the cut groove forming step along the remaining division lines 23 extending in the second direction perpendicular to the first direction.

After performing the cut groove forming step mentioned above, a laser processing step is performed in such a manner that the semiconductor wafer 2 with the protective tape 3 is held on a holding surface of workpiece holding means in the condition where the protective tape 3 is in contact with the holding surface and a laser beam having an absorption wavelength to the substrate 20 and the functional layer 21 is next applied to the semiconductor wafer 2 from the back side 20b of the substrate 20 along the bottom of each cut groove 25 to form a laser processed groove having a depth reaching the protective tape 3 along each division line 23, thereby dividing the semiconductor wafer 2 into individual device chips. This laser processing step is performed by using a laser processing apparatus 5 shown in FIG. 7. The laser processing apparatus 5 shown in FIG. 7 is the same as that shown in FIG. 3.

Figure 7:
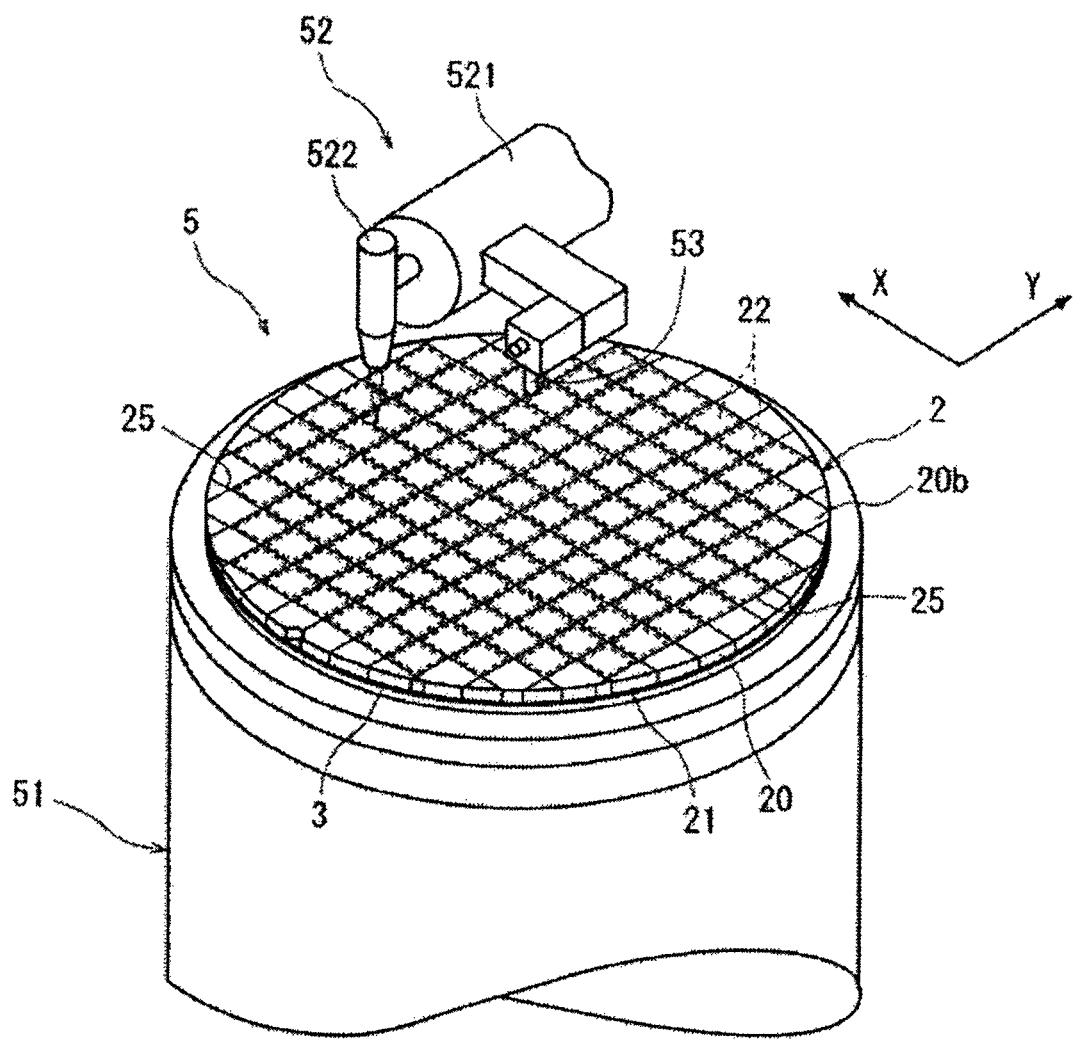
FIG. 7 is a perspective view of an essential part of a laser processing apparatus for performing a laser processing step in the second preferred embodiment of the wafer dividing step.

In performing the laser processing step using the laser processing apparatus 5 shown in FIG. 7, the semiconductor wafer 2 processed by the cut groove forming step is placed on the chuck table 51 in the condition where the protective tape 3 attached to the semiconductor wafer 2 is in contact with the upper surface (holding surface) of the chuck table 51. Thereafter, the suction means (not shown) is operated to hold the semiconductor wafer 2 through the protective tape 3 on the chuck table (wafer holding step). Accordingly, the back side 20b of the substrate 20 of the semiconductor wafer 2 held on the chuck table 51 is oriented upward. Although an annular frame supporting the protective tape 3 is not shown in FIG. 7, this annular frame is held by suitable frame holding means provided on the chuck table 51. Thereafter, the chuck table 51 holding the semiconductor wafer 2 is moved to a position directly below the imaging means 53 by operating the feeding means (not shown).

In the condition where the chuck table 51 is positioned directly below the imaging means 53, an alignment operation is performed by the imaging means 53 and the control means (not shown) to detect a subject area of the semiconductor wafer 2 to be laser-processed. More specifically, the imaging means 53 and the control means perform image processing such as pattern matching for making the alignment of the cut grooves 25 extending in the first direction on the back side 20b of the substrate 20 of the semiconductor wafer 2 and the focusing means 522 of the laser beam applying means 52 for applying the laser beam to the wafer 2 along the cut grooves 25, thus performing the alignment of a laser beam applying position (alignment step). Similarly, the alignment of a laser beam applying position is performed for the other cut grooves 25 extending in the second direction perpendicular to the first direction.

Figure 8A:
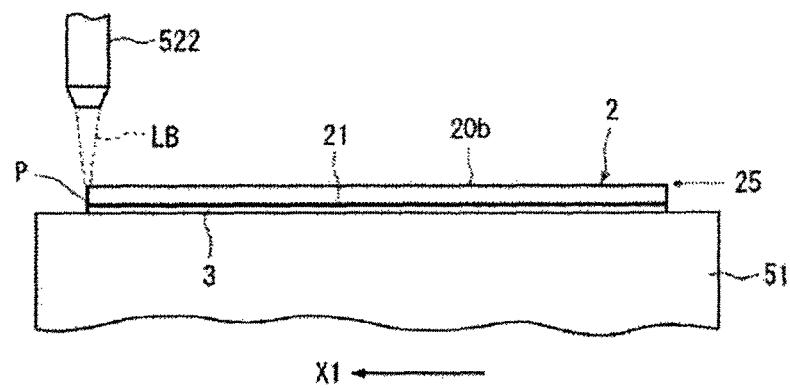
FIGS. 8A to 8D are views for illustrating the laser processing step.
Figure 8B:
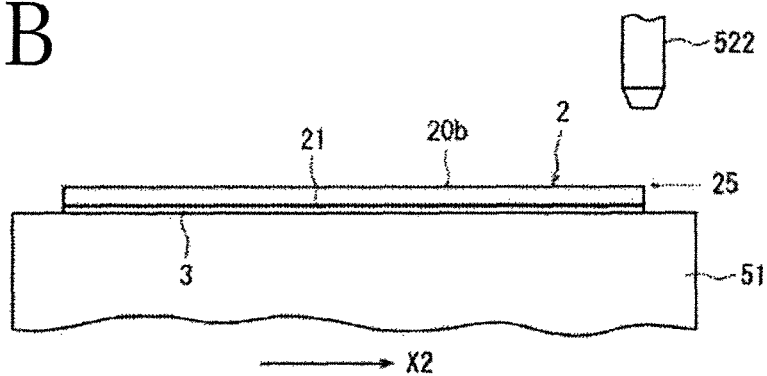
Figure 8C:
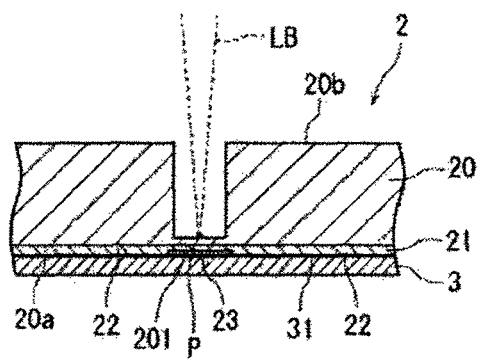

After performing the alignment step mentioned above, the chuck table 51 is moved to a laser beam applying area where the focusing means 522 of the laser beam applying means 52 is located as shown in FIG. 8A, thereby positioning one end (left end as viewed in FIG. 8A) of a predetermined one of the cut grooves 25 directly below the focusing means 522. Further, the focal point P of the pulsed laser beam to be applied from the focusing means 522 is set near the bottom of the predetermined cut groove 25 as shown in FIG. 8C. Thereafter, the pulsed laser beam having an absorption wavelength to the substrate 20 and the functional layer 21 is applied from the focusing means 522 to the wafer 2, and the chuck table 51 is moved in the direction shown by an arrow X1 in FIG. 8A at a predetermined feed speed. When the other end (right end as viewed in FIG. 8B) of the predetermined cut groove 25 reaches the position directly below the focusing means 522 as shown in FIG. 8B, the application of the pulsed laser beam is stopped and the movement of the chuck table 51 is also stopped (laser processing step).

Thereafter, the chuck table 51 is moved in the indexing direction of the arrow Y (in the direction perpendicular to the sheet plane of FIG. 8B) by an amount corresponding to the pitch of the cut groove 25 (corresponding to the pitch of the division lines 23). Thereafter, the pulsed laser beam is applied from the focusing means 522 to the semiconductor wafer 2, and the chuck table 51 is moved in the direction shown by an arrow X2 in FIG. 8B at a predetermined feed speed. When the chuck table 51 is returned to the position shown in FIG. 8A, the application of the pulsed laser beam is stopped and the movement of the chuck table 51 is also stopped.

Figure 8D:
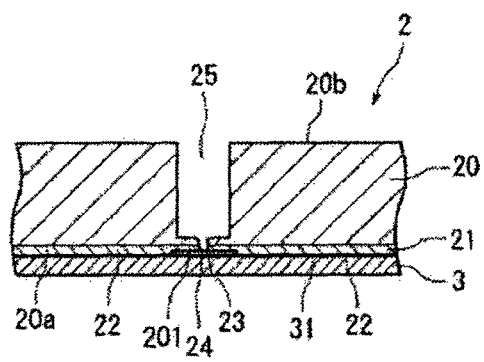

By performing the laser processing step mentioned above, a laser processed groove 24 having a depth reaching the protective tape 3 is formed in the part 201 of the substrate 20 and the functional layer 21 of the semiconductor wafer 2 along each cut groove 25 as shown in FIG. 8D. As a result, the part 201 of the substrate 20 and the functional layer 21 in the area corresponding to each division line 23 are divided by the laser processed groove 24. The laser processing step mentioned above is similarly performed along all of the division lines 23 (along all of the cut grooves 25), thereby forming a similar laser processed groove 24 in the part 201 of the substrate 20 and the functional layer 21 of the semiconductor wafer 2 along each division line 23, wherein each laser processed groove 24 has a depth reaching the protective tape 3. That is, the semiconductor wafer 2 is divided into the individual device chips corresponding to the devices 22. In this laser processing step, debris may be generated from the semiconductor wafer 2 by the application of the pulsed laser beam having an absorption wavelength to the substrate 20 and the functional layer 21. However, since the protective tape 3 is closely attached to the functional layer 21 in such a manner that the adhesive layer 31 of the protective tape 3 is in tight contact with the devices 22 formed from the functional layer 21, the debris can be prevented from adhering to the devices 22. The debris generated by the application of the pulsed laser beam adheres to the adhesive layer 31 of the protective tape 3 in an area corresponding to each division line 23.

In the second preferred embodiment of the wafer dividing step mentioned above, the cut groove 25 is formed in the substrate 20 of the semiconductor wafer 2 along each division line 23. Accordingly, as compared with the first preferred embodiment of the wafer dividing step shown in FIGS. 4A to 4C, the power of the pulsed laser beam can be reduced in the second preferred embodiment of the wafer dividing step.

Figure 9A:
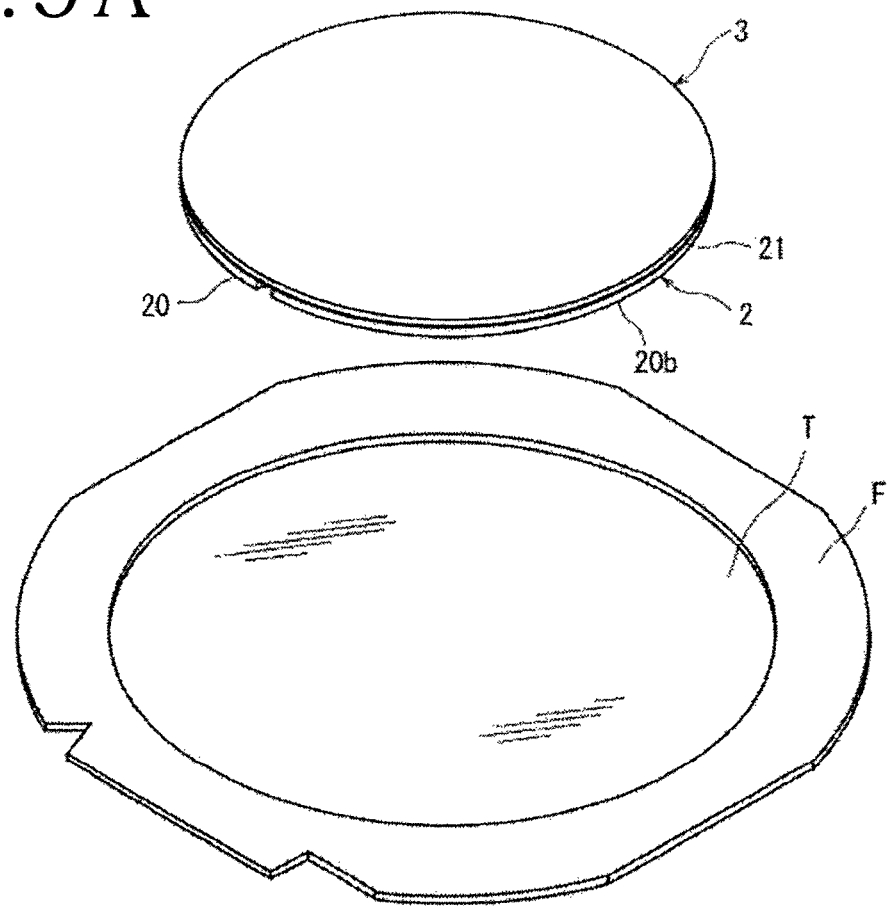
FIGS. 9A and 9B are perspective views for illustrating a wafer supporting step.
Figure 9B:
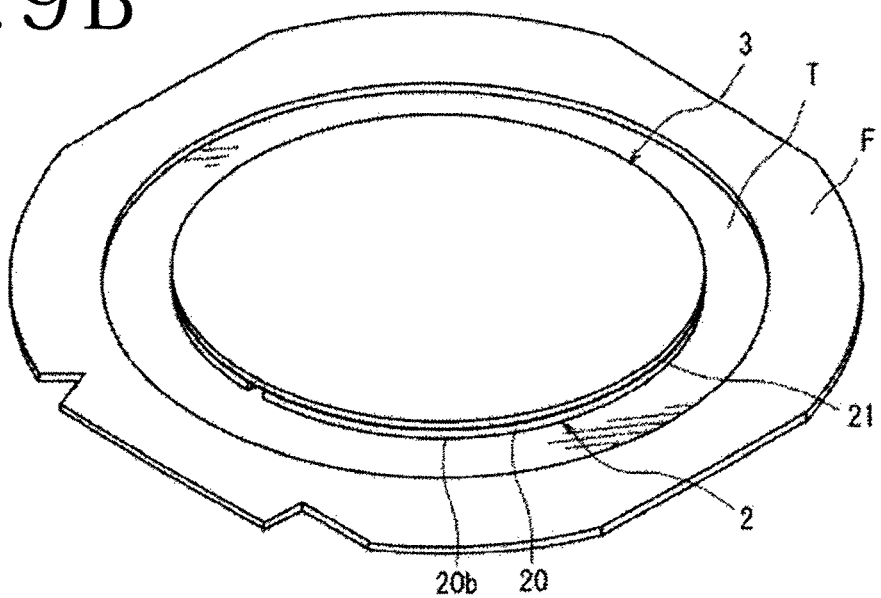

After performing the wafer dividing step mentioned above, a wafer supporting step is performed in such a manner that the back side 20b of the substrate 20 of the semiconductor wafer 2 is attached to a dicing tape and the dicing tape is supported at its peripheral portion to an annular frame having an inside opening capable of receiving the semiconductor wafer 2, thereby supporting the semiconductor wafer 2 through the dicing tape to the annular frame. More specifically, as shown in FIGS. 9A and 9B, a dicing tape T is preliminarily supported at its peripheral portion to an annular frame F having an inside opening, so that the inner opening of the annular frame F is closed by the dicing tape T. In this condition, the back side 20b of the substrate 20 of the semiconductor wafer 2 is attached to the front side (adhesive side) of the dicing tape T exposed to the inside opening of the annular frame F. Accordingly, the protective tape 3 attached to the front side 21a of the functional layer 21 of the semiconductor wafer 2 is oriented upward in the condition where the semiconductor wafer 2 is attached to the dicing tape T. For example, the dicing tape T is composed of a polyethylene film having a thickness of 100 µm and an adhesive layer formed on the front side of the polyethylene film. While the back side 20b of the substrate 20 of the semiconductor wafer 2 is attached to the dicing tape T preliminarily supported at its peripheral portion to the annular frame F in this preferred embodiment shown in FIGS. 9A and 9B, the dicing tape T may be attached to the back side 20b of the substrate 20 of the semiconductor wafer 2 and at the same time the peripheral portion of the dicing tape T may be mounted to the annular frame F.

Figure 10A:
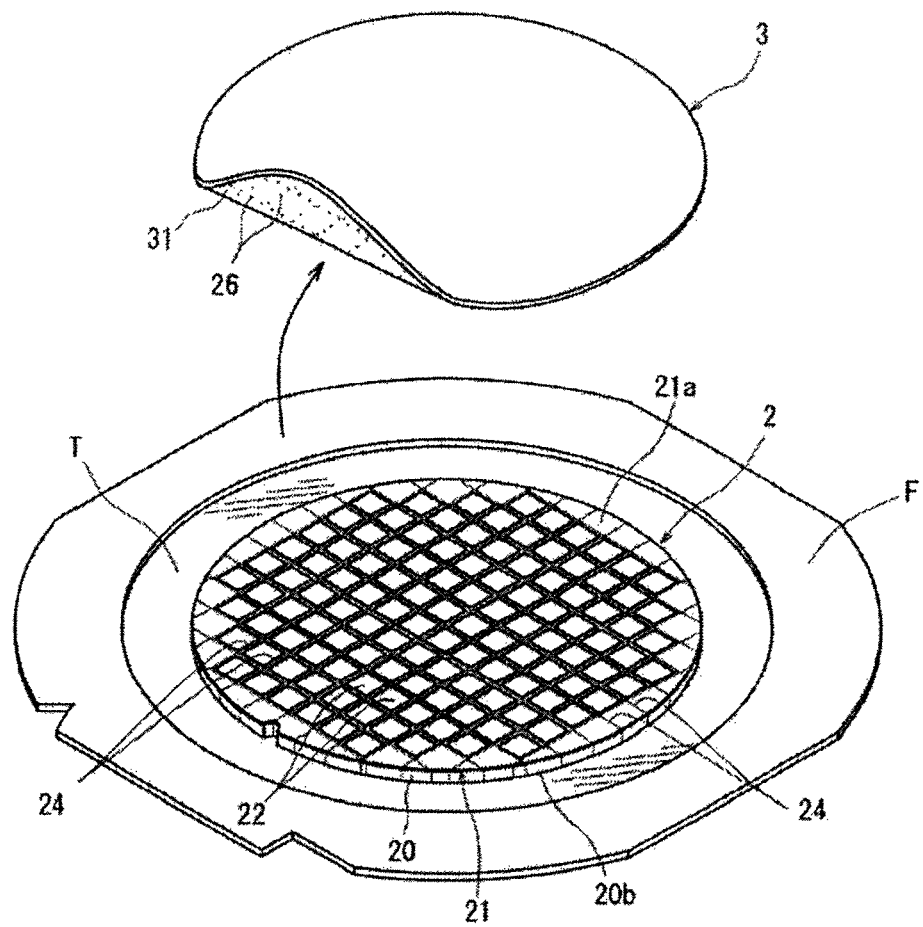
FIGS. 10A and 10B are perspective views for illustrating a protective tape peeling step.
Figure 10B:
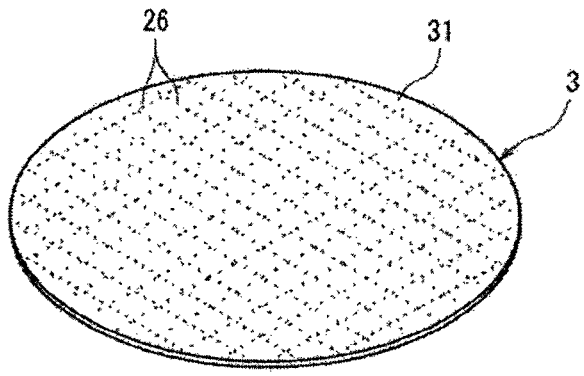

After performing the wafer supporting step mentioned above, a protective tape peeling step is performed as shown in FIG. 10A in such a manner that the protective tape 3 attached to the front side 21a of the functional layer 21 of the semiconductor wafer 2 is peeled off. As shown in FIG. 10B, debris 26 generated by the application of the pulsed laser beam in the wafer dividing step adheres to the adhesive layer 31 of the protective tape 3 peeled from the front side 21a of the functional layer 21 of the semiconductor wafer 2. In this manner, the debris 26 generated by the application of the pulsed laser beam in the wafer dividing step adheres to the adhesive layer 31 of the protective tape 3, so that the debris 26 is prevented from adhering to the devices 22 formed from the functional layer 21 of the semiconductor wafer 2.

Figure 11:
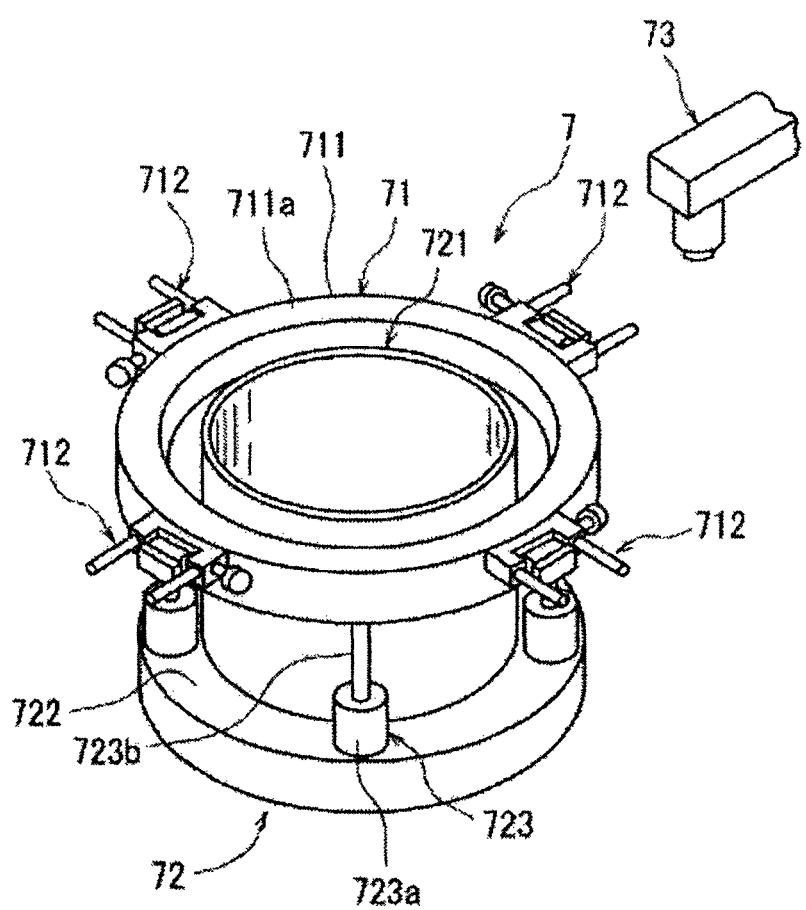
FIG. 11 is a perspective view of a tape expanding apparatus for performing a tape expanding step.

After performing the wafer supporting step and the protective tape peeling step mentioned above, a tape expanding step is performed in such a manner that the dicing tape T attached to the back side 20b of the substrate 20 of the semiconductor wafer 2 is expanded to increase the spacing between the devices 22 already separated from each other. This tape expanding step is performed by using a tape expanding apparatus 7 shown in FIG. 11. The tape expanding apparatus 7 shown in FIG. 11 includes frame holding means 71 for holding the annular frame F, tape expanding means 72 for expanding the dicing tape T supported to the annular frame F held by the frame holding means 71, and a pickup collet 73. The frame holding means 71 includes an annular frame holding member 711 and a plurality of clamps 712 as fixing means provided on the outer circumference of the frame holding member 711. The upper surface of the frame holding member 711 functions as a mounting surface 711a for mounting the annular frame F thereon. The annular frame F mounted on the mounting surface 711a is fixed to the frame holding member 711 by the clamps 712. The frame holding means 71 is supported by the tape expanding means 72 so as to be vertically movable.

Figure 12A:
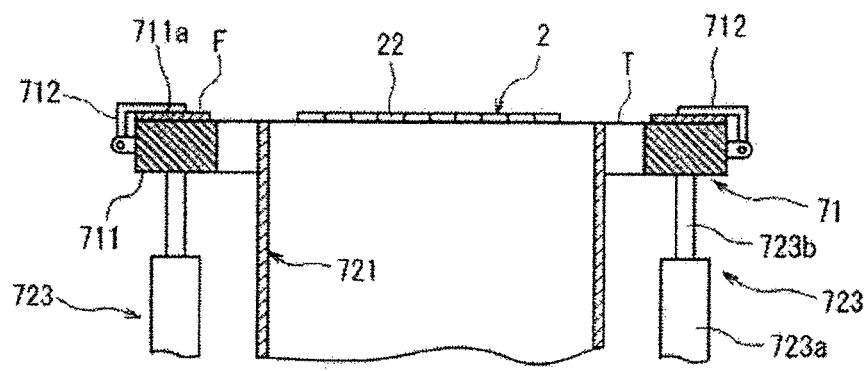
FIGS. 12A to 12C are views for illustrating the tape expanding step.
Figure 12B:
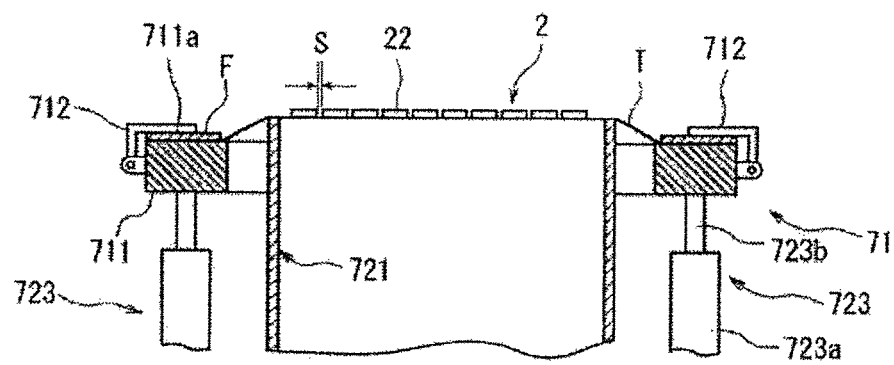

The tape expanding means 72 includes an expanding drum 721 provided inside of the annular frame holding member 711. The expanding drum 721 has an outer diameter smaller than the inner diameter of the annular frame F and an inner diameter larger than the outer diameter of the semiconductor wafer 2 attached to the dicing tape T supported to the annular frame F. The expanding drum 721 has a supporting flange 722 at the lower end of the drum 721. The tape expanding means 72 further includes supporting means 723 for vertically movably supporting the annular frame holding member 711. The supporting means 723 is composed of a plurality of air cylinders 723a provided on the supporting flange 722. Each air cylinder 723a is provided with a piston rod 723b connected to the lower surface of the annular frame holding member 711. The supporting means 723 composed of these plural air cylinders 723a functions to vertically move the annular frame holding member 711 so as to selectively take a reference position where the mounting surface 711a is substantially equal in height to the upper end of the expanding drum 721 as shown in FIG. 12A and an expansion position where the mounting surface 711a is lower in height than the upper end of the expanding drum 721 by a predetermined amount as shown in FIG. 12B.

The tape expanding step using the tape expanding apparatus 7 will now be described with reference to FIGS. 12A to 12C. As shown in FIG. 12A, the annular frame F supporting the semiconductor wafer 2 through the dicing tape T is mounted on the mounting surface 711a of the frame holding member 711 of the frame holding means 71 and fixed to the frame holding member 711 by the clamps 712 (frame holding step). At this time, the frame holding member 711 is set at the reference position shown in FIG. 12A. Thereafter, the air cylinders 723a as the supporting means 723 of the tape expanding means 72 are operated to lower the frame holding member 711 to the expansion position shown in FIG. 12B. Accordingly, the annular frame F fixed to the mounting surface 711a of the frame holding member 711 is also lowered, so that the dicing tape T supported to the annular frame F comes into abutment against the upper end of the expanding drum 721 and is expanded as shown in FIG. 12B (tape expanding step). As a result, a tensile force acts on the semiconductor wafer 2 attached to the dicing tape T in the radial direction of the semiconductor wafer 2. Accordingly, an increased spacing S is formed between any adjacent ones of the individual devices 22 already separated from each other as shown in FIG. 12B.

Figure 12C:
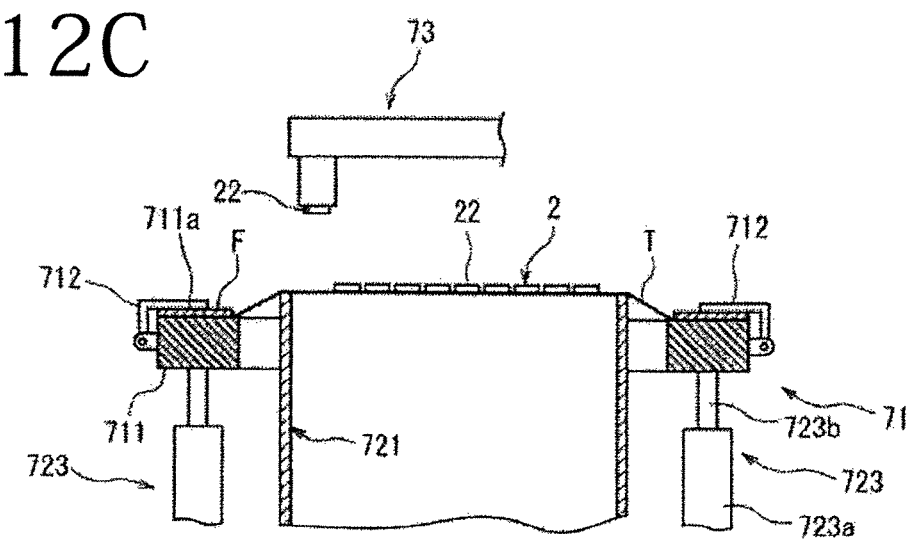

Thereafter, the pickup collet 73 is operated to hold each device 22 under suction and peel it from the dicing tape T, thus individually picking up the devices 22 as shown in FIG. 12C (pickup step). Thereafter, each device 22 as a device chip thus picked up is transferred to a tray (not shown) or a position where a die bonding step is performed. By performing the tape expanding step, the increased spacing S is formed between any adjacent ones of the individual devices 22 attached to the dicing tape T, so that each device 22 can be easily picked up without the contact with its adjacent device 22 in the pickup step.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method for dividing a wafer into a plurality of individual devices along a plurality of division lines formed on a front side of said wafer, said wafer being composed of a substrate and a functional layer formed on a front side of said substrate, said individual devices being formed from said functional layer and partitioned by said division lines, said wafer processing method comprising:
   a protective tape attaching step of attaching a protective tape having an adhesive layer to a front side of said functional layer of said wafer in a condition where said adhesive layer of said protective tape is in contact with the front side of said functional layer; and
   a wafer dividing step of holding said wafer processed by said protective tape attaching step on a holding surface of a chuck table in a condition where said protective tape is in contact with said holding surface, wherein said wafer dividing step includes a cut groove forming step and a laser processing step,
   wherein said cut groove forming step includes using a cutting blade to form a cut groove on a back side of said substrate along each division line so that a depth of the cut groove does not reach said functional layer, thereby resulting in part of said substrate being left along each division line after performing said cut groove forming step, and
   wherein said laser processing step includes applying a laser beam having an absorption wavelength to said part of said substrate left after said cut groove forming step and said functional layer of said wafer from the back side of said substrate along each division line to form a laser processed groove having a depth reaching said protective tape along each division line, thereby dividing said wafer into individual device chips corresponding to said individual devices,
   wherein said protective tape is closely attached to the front side of said functional layer in said protective tape attaching step in such a manner that said adhesive layer of said protective tape comes into tight contact with said devices formed from said functional layer, so as to prevent the adhesion of debris to a front side of each device, said debris being generated from said wafer along each division line by the application of said laser beam in said wafer dividing step, and
   wherein said protective tape attaching step comprises a contacting step of placing said adhesive layer of said protective tape in contact with the front side of said functional layer of said wafer, and a step of applying pressure to said protective tape, wherein said pressure applying step is performed after said contacting step.

2. The wafer processing method according to claim 1, wherein said pressure applying step comprises rolling a pressing roller on said protective tape to apply a pressure thereto.

3. The wafer processing method according to claim 1, wherein during said cut groove forming step, a lower end of the cutting blade is separated from the front side of the substrate by an amount of between 5 µm and 10 µm.

4. The wafer processing method according to claim 1, further comprising:
   a wafer supporting step of attaching said substrate to a dicing tape supported by an annular frame, wherein said wafer supporting step is performed after said laser processing step; and
   a protective tape peeling step of peeling off the protective tape, wherein said protective tape peeling step is performed after said wafer supporting step.

5. The wafer processing method according to claim 4, wherein the debris generated during said wafer dividing step are adhered to the protective tape that has been peeled off.

* * * * *